United States Patent
Mastrocola

[19]

[11] Patent Number: 5,812,024
[45] Date of Patent: Sep. 22, 1998

[54] STABILIZATION OF GAIN-BANDWIDTH PRODUCT IN ANALOG CIRCUIT DEVICES

[75] Inventor: Angelo R. Mastrocola, West Lawn, Pa.

[73] Assignee: Lucent Technologies Inc., Del.

[21] Appl. No.: 792,823

[22] Filed: Jan. 30, 1997

[51] Int. Cl.$^6$ .................................................. H03F 1/02
[52] U.S. Cl. ............................... 330/9; 330/289; 330/296
[58] Field of Search ........................... 330/9, 261, 285, 330/289, 296

[56] References Cited

U.S. PATENT DOCUMENTS

| | | | |
|---|---|---|---|
| 4,253,033 | 2/1981 | Redfern | 330/296 X |
| 4,484,089 | 11/1984 | Viswanathan | 330/289 X |
| 4,721,920 | 1/1988 | Poletto et al. | 330/261 X |

OTHER PUBLICATIONS

Laber, et al, A 20MHz $6^{th}$ Order BiCMOS Programmable Filter, 1992 Symposium on VLSI Circuits Digest, pp. 104–105.

Laber, et al, Design Considerations for a High Performance 3–$\mu$m CMOS, IEEE Journal of Solid–State Circuits, Apr. 1987 pp. 181–189.

De Veirman, et al, A 27MHz Programmable Bipolar 0.05° Equiripple, IEEE Int'l Solid–State Circuits Conf.–Digest, Feb. 1992, p. 64 et seq.

De Veirman, et al, design of a Bipolar 10–MHz Programmable Continuous–Time 0.05°, IEEE Journal of Solid–State Circuits Mar. 1992, pp. 324–331.

Pipilos, et al, 1.8 GHz Tunable Filter in Si Technology, IEEE Custom Integrated Circuits Conf. 1996, pp. 189–192.

Burger, et al, A 100dB, 480 MHz OTA in 0.7 $\mu$m CMOS, IEEE Custom Integrated Circuits Conf. 1996, pp. 101–104.

Siniscalchi, et al, High–Precision, Programmable 1–10MHz bandwidth, IEEE Custom Integrated Circuits Conf. 1996, pp. 85–88.

Macedo, et al, A 2.5GHz Monolithic Silicon Image Reject Filter, IEEE Custom Integrated Circuits Conf. 1996, pp. 193–196.

*Primary Examiner*—Steven Mottola

[57] ABSTRACT

The gain-bandwidth product for an integrated circuit is stabilized by operating a first capacitance element that tracks a load capacitance of an integrated circuit to be stabilized over a given range of ambient operating conditions, and operating a first control element having a control terminal and first and second controlled terminals in a triode operating region. The conductance of the first control element is set to correspond to an effective conductance of the first capacitance element by developing a feedback control voltage and coupling the control voltage to the control terminal of the first control element. The control voltage is also coupled to a control terminal of a second control element, and a controlled terminal current of the second control element is coupled to the integrated circuit to be stabilized while operating the second control element in a saturation region. The gain-bandwidth product of the integrated circuit is controlled with respect to ambient operating conditions by establishing a bias current in the integrated circuit that corresponds to the controlled terminal current of the second control element.

16 Claims, 2 Drawing Sheets

STABILIZATION OF GAIN-BANDWIDTH PRODUCT IN ANALOG CIRCUIT DEVICES

BACKGROUND OF THE INVENTION

1. Field of the Invention

The present invention relates generally to regulation of analog circuits over variations of ambient operating conditions, and particularly to a method and circuitry for stabilizing the gain-bandwidth product of analog circuit devices.

2. Discussion of the Known Art

The gain-bandwidth product (GBW) for an analog circuit device, e.g., an operational amplifier (op-amp), is defined as the product of the device DC gain, and the frequency at which the gain of the device is about 3-dB down from the DC gain. For a simple single stage op-amp, the DC gain is gm/go and the 3 db pole frequency is go/C. It can be shown that the gain-bandwidth product for the device equals gm/C; wherein go=output conductance at dominant pole node, C=capacitance at dominant pole node, and gm=input transconductance. It is also known that for a MOSFET differential pair, the transconductance $gm_{DP}$ ideally is a function of the device DC bias current (I), and (β), where $I=\beta(V_{GS}-V_T)^2/2$ and, $gm_{DP}=(2I\beta)^{1/2}$.

For other topologies, for example a simple two-stage op-amp, the exact equations may be different, but the general result is the same. Namely, the gain-bandwidth product substantially comprises a ratio of a transconductance to a capacitance.

A problem arises in the design of certain analog circuit devices such as continuous time filters, buffers, gain stages and the like. Preferably, the signal bandwidth, stability (Q and phase margin), and noise bandwidth for such devices should be well controlled for a specified range of operating conditions. But the gain-bandwidth product or gm/C ratio for these devices and other analog circuits conducting DC current, is known to change with variations in processing parameters, temperature, and supply voltage (hereafter "ambient operating conditions"). If the gm/C ratio for the devices can be kept stable over a given range of ambient operating conditions, the design of these devices becomes much less burdensome.

It is known to bias op-amps with currents that are proportional to absolute temperature (PTAT), to counter a reduction in gm with respect to an increase of temperature. See, for example; P. Siniscalchi, et al., High-Precision, Programmable 1–10 MHZ Bandwidth, 0–20 dB Gain Communication Channel, IEEE 1996 Custom Integrated Circuits Conference, at 85, 87, and G. A. De Veirman, et al, Design of a Bipolar 10-MHz Programmable Continuous-Time 0.05° Equiripple Linear Phase Filter, IEEE Journal of Solid-State Circuits (March 1992) at page 328. A discussion of optimization of GBW in a CMOS operational transconductance amplifier (OTA), is set out in T. Burger, et al., A 100 dB, 480 MHZ OTA, Id., at 101, 102–3.

U.S. Pat. No. 4,484,089 (Nov. 20, 1984) discloses a switched-capacitor arrangement for conductance control of variable transconductance elements. See also U.S. patent application Ser. No. 08/741,067 entitled Method of Biasing MOSFET Amplifiers for Constant Transconductance, filed Oct. 30, 1996, and assigned to the assignee of the present invention.

SUMMARY OF THE INVENTION

According to the invention, a method of stabilizing a gain-bandwidth product for an integrated circuit, comprises operating a first capacitance element that tracks a load capacitance of an integrated circuit to be stabilized over a given range of ambient operating conditions, operating a first control element having a control terminal and first and second controlled terminals in a triode operating region, setting a conductance of the first control element to correspond to an effective conductance of said first capacitance element by developing a feedback control voltage and coupling the control voltage to the control terminal of the first control element, coupling the control voltage to a control terminal of a second control element with a controlled terminal of the second control element being coupled to the integrated circuit to be stabilized and operating the second control element in a saturation region with a corresponding controlled terminal current, and controlling the gain-bandwidth product of the integrated circuit with respect to ambient operating conditions by establishing a bias current in the integrated circuit that corresponds to the controlled terminal current of the second control element.

For a better understanding of the invention, reference is made to the following description taken in conjunction with the accompanying drawing, and the scope of the invention will be pointed out in the appended claims.

DETAILED DESCRIPTION OF THE INVENTION

An important figure of merit for an op-amp device is its gain-bandwidth product or GBW. Ideally, this is the frequency at which the input to output voltage gain of the device is unity (0 dB). As mentioned, the GBW can be determined for op-amp topologies by a ratio of input device transconductance to load capacitance, i.e., gm/C.

Figures 1, 2:
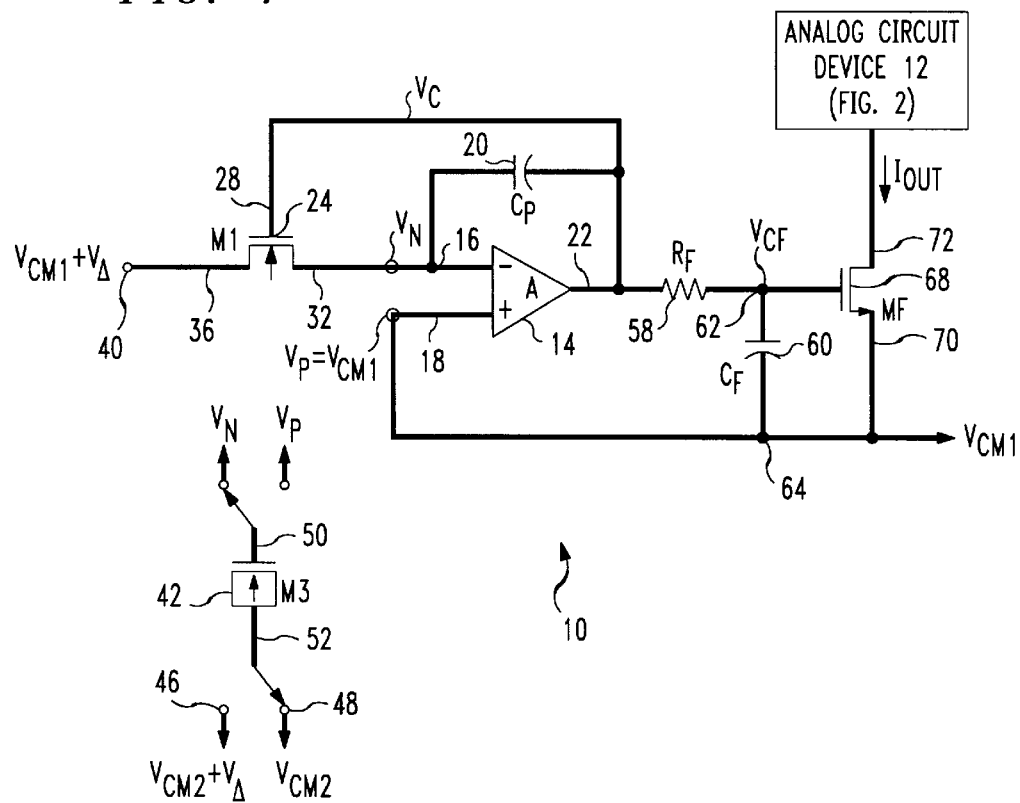
FIG. 1 is an electrical schematic diagram of a gain-bandwidth product (GBW) stabilization circuit according to the invention.
FIG. 2 is a schematic diagram of an analog circuit device whose GBW is stabilized by the circuit of FIG. 1.

FIG. 1 is an electrical schematic diagram of a stabilization circuit 10 for stabilizing the gain-bandwidth product of an analog circuit device 12. The device 12 is described below in connection with FIG. 2.

The stabilization circuit 10 is preferably formed on an integrated circuit (IC) substrate, in common with the circuit 12 whose GBW is to be stabilized by operation of the circuit 10. For example, both of the circuits 10, 12 can be realized on one IC chip using known analog complementary metal oxide semiconductor (CMOS) fabrication techniques. In order to achieve the most effectiveness for the present GBW stabilization scheme, it is necessary that both of the circuits 10, 12 be subject to substantially identical variations of ambient operating conditions, namely; processing parameters, temperature and supply voltage.

In the circuit 10 of FIG. 1, a differential op-amp 14 has an inverting input terminal 16 ($V_N$) and a non-inverting input terminal 18 ($V_P$). A capacitor 20 ($C_P$) is coupled between an output terminal 22 of the op-amp 14 and its inverting input terminal 16.

A MOS field effect element 24 (M1) has a gate terminal 28 connected in a servo or feedback loop to the output terminal 22 of op-amp 14. A source terminal 32 of MOS element 24 is connected to the inverting input terminal 16 of op-amp 14. A drain terminal 36 of MOS element 24 is connected to a terminal 40 of a reference voltage supply $V_{CM1}+V\Delta$. The voltage at the terminal 40 of the reference voltage supply may be derived from a common mode reference voltage $V_{CM1}$ which is offset by a determined amount $V\Delta$.

A capacitance element 42 (M3) is arranged in a switched capacitor configuration. In the illustrated embodiment, M3 is an n-channel MOS device biased in inversion and used as a MOS capacitor. Specifically, M3 has two terminals 50, 52 one of which (50) is switched at a determined clock rate $f_C$ between the non-inverting input terminal 18 ($V_P$) and the inverting input terminal 16 ($V_N$) of op-amp 14. The other terminal 52 of M3 is switched simultaneously with the terminal 50 between terminals 46, 48. The voltages at terminals 46, 48 may be derived from a common mode reference voltage $V_{CM2}$ and are offset from one another by a determined amount $V\Delta$.

With M3 biased as an n-channel device in inversion, $V_{CM1}$ should be sufficiently greater than $V_{CM2}$ so that M3 is always in inversion. M3 may be a low threshold device, or it can be an n-channel device biased in an accumulation mode instead of in an inversion mode. If M3 is an n-channel device biased in accumulation, or, alternatively, a p-channel device biased in inversion, the voltages at terminals 46, 48, should be more positive than those at op-amp input terminals 16, 18, by an amount sufficient to keep the capacitance of M3 relatively constant.

M3 may be another type of capacitor instead of an n-channel MOSFET, for example, a polysilicon capacitor. In any event, the capacitance element 42 should be the same type of capacitance element as a load capacitance element in the analog circuit device whose GBW is to be stabilized by the circuit of FIG. 1.

Switching of the terminals 50, 52 of capacitance element 42 (M3), is synchronized such that when M3's terminal 50 is switched to op-amp input terminal 18 ($V_P$), M3's terminal 52 is switched to reference voltage terminal 46. When M3's terminal 50 is switched to op-amp input terminal 16 ($V_N$), M3's terminal 52 is switched to reference voltage terminal 48. The switches for the capacitance element terminals 50, 52 may be conventional SPDT electronically controlled MOS switch configurations which are responsive to non-overlapping clock signals at the frequency $f_c$.

The output terminal 22 of op-amp 14 is connected to a filter network comprising a resistor 58 ($R_F$), and a capacitor 60 ($C_F$). Op-amp output terminal 22 is connected to one side of resistor 58, and the other side of resistor 58 is connected at node 62 to one side of capacitor 60. The other side of capacitor 60 is connected to node 64 which is tied to reference voltage $V_{CM1}$.

Node 62 is also connected to a control terminal 66 of a MOS bias current control device 68 (MF). Device 68 has a source terminal 70 which is connected to node 64 ($V_{CM1}$). A drain terminal 72 of device MF is coupled to the analog circuit device 12, so that a DC bias current is established for the device 12 which bias current is proportional to the drain current $I_{OUT}$ through device MF.

Instead of using the filter network ($R_F$, $C_F$) at the output terminal 22 of op-amp 14, it may be desirable to use an additional clock and switching scheme disclosed in the mentioned U.S. Pat. No. 4,484,089 (as switch 22, clock P3).

All relevant portions of the '089 patent are incorporated by reference herein. Such a scheme may help to isolate device MF from the effects of voltage-swings induced at op-amp A's output 22 by switching actions at its input terminals 16, 18.

FIG. 2 is a diagram of a CMOS analog circuit device 12 whose GBW is stabilized by the circuit 10 of FIG. 1. For purposes of illustration only and without limitation of the kinds of analog circuit devices whose GBW can be stabilized according the invention, the circuit device 12 is a differential op-amp comprising an input pair of MOSFETs 100, 102 (M10, M12).

A small-signal AC difference voltage ($V_{IP}-V_{IN}$) is applied on input (gate) terminals 104, 106 of the M10, M12 pair. The differential input voltage is converted to an AC differential current out from elements M10, M12. One branch of the AC output current, beginning from drain terminal 108 of M10, is for most frequencies of interest substantially directed through a series path of element 110 (M6) and output node ON. Past $f_{3db}$, more current passes through MCN and other capacitance paths to A.C. ground, than through M8. The other branch of the output current, beginning from drain terminal 114 of M12, for most frequencies of interest substantially follows a path through element 116 (M7) and output node OP. Past $f_{3db}$, more current passes through MCP and other capacitance paths to A.C. ground than through M9. MOS capacitance element 120 (MCN) is connected between amplifier output node ON and ground, and MOS capacitance device 122 (MCP) is connected between output node OP and ground. As mentioned, at sufficiently high frequencies, most of the AC output current flows through the MOS load capacitance devices MCN and MCP, and perhaps other capacitance paths (not shown) from nodes OP, ON to AC ground.

The drain terminal 72 of the bias current control element 68 (MF) in stabilizing circuit 10, is connected to a drain terminal 124 of a MOSFET 126 (M5) associated with the stabilized analog device 12. Thus, the current $I_{OUT}$ in FIG. 1 also flows through M5, and the current is mirrored to another MOSFET 128 (M16) associated with analog device 12. The mirrored current is sent to a MOSFET 130 (M18) that is series connected with M16, and M18 is coupled to another MOSFET M14 which determines a bias current I5 for the differential op-amp pair M10, M12.

It may be desirable to set the common mode (reference) voltage $V_{CM1}$ in the stabilization circuit 10 of FIG. 1, to track the source voltage $V_{CM12}$ of devices 100, 102 (M10, M12) in the stabilized op-amp device 12 of FIG. 2. This places the "tuned" and the "tuning" devices in a more equal operating environment.

Figure 3:
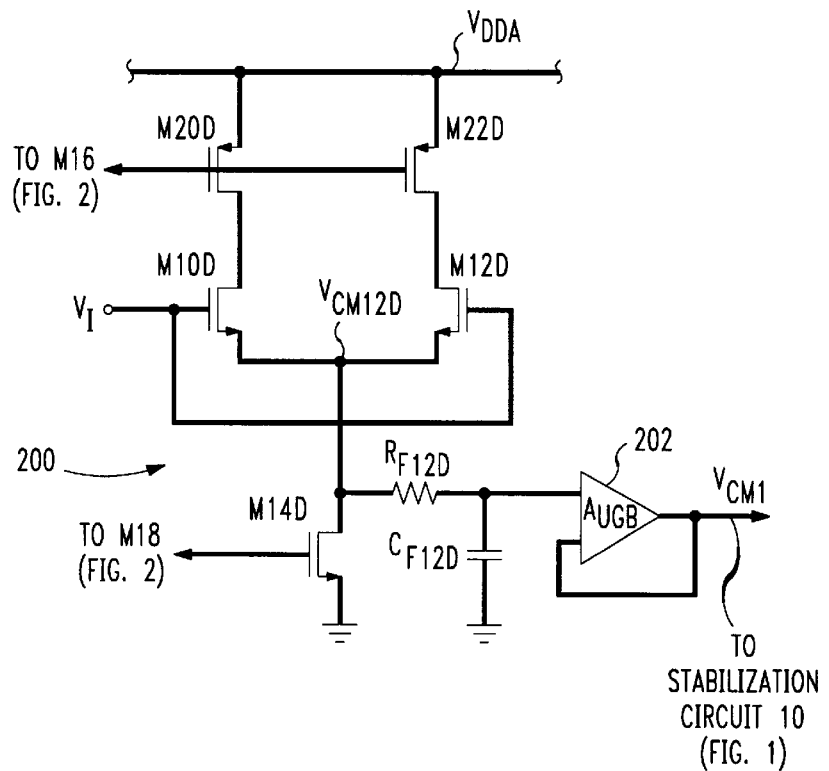
FIG. 3 is a schematic diagram of a circuit for obtaining a common mode reference voltage.

A "dummy" circuit 200 for deriving the common mode voltage $V_{CM1}$ for the stabilization circuit 10, from a voltage corresponding to $V_{CM12}$ of the stabilized circuit 12, is shown in FIG. 3. Dummy circuit 200 is fabricated to mimic the DC voltages of the active analog circuit device 12. MOS devices corresponding to those in FIG. 2, have corresponding reference designations followed by the letter D. Resistor $R_{F12D}$ and capacitor $C_{F12D}$ provide local filtering of $V_{CM12D}$, and a filtered input voltage is applied to op-amp 202 which acts as a buffer device. An output voltage $V_{CM1}$ from device 202 is supplied to the stabilization circuit 10 in FIG. 1. The feedback loop in device 202, between dummy circuit 200 and the stabilizing circuit 10 (FIG. 1), should be properly compensated to ensure good stability, and designed properly as understood in the art to ensure a good DC operating state.

MOS elements corresponding to M13, M6, M7 and other elements in the differential op-amp device 12 of FIG. 2, may be replicated in the dummy circuit 200 if necessary to obtain additional accuracy in replicating the voltage $V_{CM12}$ as the output voltage $V_{CM1}$.

Figure 4:
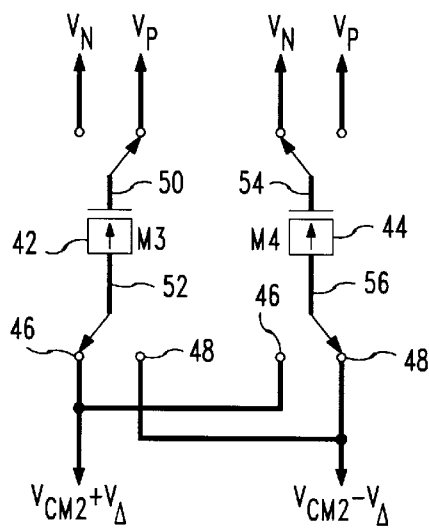
FIG. 4 is a schematic diagram of a switched capacitor pair that can be substituted for a single switched capacitor in the circuit of FIG. 1.

FIG. 4 shows a pair of switched capacitor elements 42, 44 that may be incorporated in the stabilization circuit 10 of FIG. 1, instead of the single element 42 in FIG. 1. Switching of the terminals 50, 52 of (M3), and terminals 54, 56 of M4, is synchronized such that when M3's terminal 50 is switched to op-amp input terminal 18 ($V_P$), M4's terminal 54 is switched to op-amp input terminal 16 ($V_N$); and when M3's terminal 52 switches to the reference voltage terminal 46, M4's terminal 56 switches to reference voltage terminal 48. Also, when terminal 50 is switched to terminal 18, terminal 52 is switched to terminal 46; and when terminal 54 is switched to terminal 16, terminal 56 is switched to terminal 48.

The switches for the capacitance element terminals 50, 52 of M3 and terminals 54, 56 of M4 may be conventional SPDT electronically controlled MOS switch configurations which are responsive to non-overlapping clock signals at the frequency $f_c$. That is, M3's and M4's terminals should not be connected to terminal 16, 18, or to terminals 46, 48, simultaneously.

Operation of the GBW stabilization circuit 10 in FIG. 1 is now described. References to capacitance element M3 may be taken to refer to the pair of capacitance elements M3 and M4 if FIG. 1 (M3 only) is modified via the arrangement of FIG. 4 (the M3, M4 pair).

Element M3 is switched as a capacitor at a clock rate of $f_c$, thus realizing a synthesized pseudo-resistor as is known generally in the art. A servo or feedback loop is realized around op-amp 14 and capacitor $C_P$ for continuous feedback to node $V_N$. The loop serves to adjust the gate bias voltage $V_C$ on MOS device M1. The bias voltage is regulated so that the resistance of the device M1 is made to follow the synthesized pseudo-resistance of the switched capacitor M3. This circuit action occurs because specific voltages are forced across M1 and M3, and whatever DC current flows through the channel of M1 is also forced to flow through the terminals (in a switched fashion) of switched capacitor element M3. At given capacitance values for element M3 and for a given clock rate $f_c$, a known pseudo-resistance is achieved by the capacitance element M3.

By forcing the effective resistances of the MOS triode device M1 and capacitance element M3 to track one another, and because the resistance of a switched capacitance element is proportional to $1/(f_c*C)$, the gate voltage of the MOS field effect device M1 is regulated so that the ratio of triode region conductance (go) to capacitance is proportional to the fixed, preset value of $f_C$.

The same control voltage $V_C$ is taken from output terminal 22 of op-amp 14, filtered at 58, 60, and applied to a control (gate) terminal 66 of device MF. The device MF operates in saturation, and has the same source voltage $V_{CM1}$ as the device M1. Thus, the gm or transconductance of device MF will be substantially proportional to the go or conductance of the device M1 which operates in the triode region.

Ideally, for saturated MOS devices:

$$IDS=u*Cox*(W/L)*(VON)^2/2 \quad \text{(Eq. Sat 1)}$$

$$gm=dIDS/dVGS=u*Cox*(W/L)*VON \quad \text{(Eq. Sat 2)}$$

wherein:

IDS is drain-to-source current,
VGS is gate-to-source voltage,
gm is transconductance,
VON=VGS−VT,
u is mobility,
L is device effective length,
W is effective width, and
Cox=MOS capacitance density.

The above two equations can be combined to yield:

$$gm=u*Cox*(W/L)*(2*IDS/(u*Cox*(W/L)))^{1/2} \quad \text{(Eq. Sat 3)}$$

$$gm=(u*Cox*(W/L)*2*IDS)^{1/2} \quad \text{(Eq. Sat 4)}$$

The last relationship will be used later when discussing the stabilized analog circuit device 12 in FIG. 2.

Again, ideally, for triode MOS devices:

$$IDS=u*Cox*(W/L)*(VON*VDS+VDS^2/2) \quad \text{(Eq. Tri 1)}$$

$$gds=go=dIDS/dVDS=u*Cox*(W/L)*(VON+VDS) \quad \text{(Eq. Tri 2)}$$

where go is the conductance of a triode MOS device.

Equation Tri 2 above can be approximated as:

$$go=u*Cox*(W/L)*VON, \text{ for } VON>>VDS \quad \text{(Eq. Tri 3)}$$

Those skilled in the art will understand that it may be desirable to apply, in the framework of the present invention, a technique disclosed in the mentioned U.S. patent application Ser. No. 08/741,067 wherein a correction is made to $V_{GS}$ of a saturated device. Such a $V_{GS}$ correction brings the saturated device's gm and the triode device's go closer in line. All relevant portions of the '067 application are incorporated by reference herein.

In view of the foregoing relationships, the gds (go) of MOS devices operating in the triode region, and the gm of saturated MOS devices, are both substantially proportional to VON. As a result, for the same VON, the triode region gds (go) and the saturated gm are substantially proportional to one another. Accordingly, the ratio of gm (for MOS element MF and MOS input elements of the stabilized circuit device 12), to load capacitance C, will also be substantially proportional to $f_C$ and will therefore be well-controlled.

With access to the output current $I_{OUT}$ of MF, its current can be brought out, scaled up or down appropriately by subsequent current mirrors, and applied to bias up other analog circuit devices to stabilize the gain-bandwidth product of such devices.

Assume that parasitic poles and zeroes do not corrupt the frequency behavior of the stabilized circuit 12 in FIG. 2. The admittance of the circuit's load capacitors is $s*C_{MCN}=s*C_{MCP}$, where $s=j*2*pi*frequency$, $j=sqrt(-1)$. Since the AC current magnitude from the input devices equals the AC current through the load capacitances, for frequencies at which the AC current substantially flows through the load capacitors, it follows that:

$$|i_{ac}(M1,M2)|=|(vip-vin)|*gm=|i_{ac}(C_{MCP,N})|=|(vop-von)|*s*C_{MCP,N}$$

At the unity gain-bandwidth frequency $f_{UG}$ (i.e., the GBW for the circuit device 12), (vip−vin) and (vop−von) have equal magnitudes (gain=1). Therefore, it follows that:

$$gm=2*pi*f_{UG}*C_{MCP,N}; \text{ and, thus, } GBW=f_{UG}=gm/(2*pi*C_{MCP,N})$$

Note the ratio of gm to capacitance. As mentioned, the device MF in the stabilization circuit of FIG. 1 is regulated so that the ratio of gm (MF) to capacitance M3 is substantially proportional to fc. The current $I_{OUT}$ of device MF is taken out, possibly scaled, mirrored, and supplied to the sources of devices M10, M12 in the stabilized circuit device 12 of FIG. 2 (in normal operation, M10 and M12 each take one-half of the current applied to their sources). In view of equations Sat 3, Sat 4, the gm's of devices M10, M12 in FIG. 2 are proportional to the gm of device MF in FIG. 1, whose gm is in turn proportional to the gds (or go) of the MOS device M3 in FIG. 1. Moreover, the ratio of gds (triode region) to capacitance (M3) is fixed and proportional to fc, as established above. And, with respect to ambient operating conditions, the load capacitors MCP, MCN of the stabilized analog circuit device 12 track the capacitor M3 in the stabilization circuit 10. That is, $C_{(MCP,MCN)}/C_{(M3,M4)}$ is constant.

In view of all the foregoing conditions, the ratio of gm to load capacitance in the stabilized analog circuit device 12, is proportional to and tracks fc over ambient operating conditions. Thus, the gain-bandwidth product of the analog circuit device 12 is fixed and proportional to fc.

If the load capacitance in the analog circuit device 12 is realized with capacitors like poly/poly instead of MOS caps, then M3 in the stabilizing circuit 10 should be replaced by poly/poly caps, and VCM2 can be set to VCM1.

In summary, op-amp A and capacitor $C_p$ in FIG. 1 servo a control voltage $V_C$ such that the conductance of MOS device M1 is proportional to a synthesized conductance of capacitance element M3. As a result, a filtered VGS voltage on device MF yields an output current $I_{OUT}$ such that the ratio of gm/C is substantially constant. When the output current is used to bias an input stage of an analog circuit device such as the differential pair M10, M12 in FIG. 2, the GBW (gm/C) of the device will be substantially insensitive to variations of processing, voltage supplies and temperature.

Although the illustrated embodiments are directed to MOS circuit configurations, it will be understood by those skilled in the art that circuit configurations equivalent to those disclosed herein may be used to stabilize the GBW product for analog circuit devices using other types of FETs including, e.g., gallium arsenide (GaAs) FETs and JFETS.

In the disclosed embodiment, op-amp A and capacitor $C_p$ act as servo means keeping node $V_N$ substantially equal to node $V_p$ in voltage. This is desirable for proper values of effective DC currents for the triode device and the switched capacitor(s). For op-amps of limited gain, it may be desirable to adopt means to ensure that the limited gain does not result in a non-zero $V_P-V_N$ voltage. Specifically, if one knows generally the expected value of $V_P-V_N$, circuitry may be added to adjust the op-amp's offset in a compensatory fashion such that a $V_P-V_N$ voltage closer to zero is generally achieved. Alternatively, if circumstances permit, the $V_P$, $V_N$ input common mode can be adjusted, making it easier to achieve the required $V_{GS}$ on the triode device without needing as much a differential input drive $V_P-V_N$ on op-amp A (resulting in $V_P-V_N$ again being generally closer to zero).

Thus, while the foregoing description represents preferred embodiments of the invention, it will be obvious to those skilled in the art that various changes and modifications may be made, without departing from the true spirit and scope of the invention as pointed out in the following claims.

What I claim is:

1. A method of stabilizing a gain-bandwidth product for an integrated circuit, comprising:

operating a first capacitance element that tracks a load capacitance of an integrated circuit to be stabilized over a given range of ambient operating conditions;

operating a first control element having a control terminal and first and second controlled terminals in a triode operating region;

setting a conductance of the first control element to correspond to an effective conductance of said first capacitance element, by developing a feedback control voltage, the control voltage being coupled to the control terminal of the first control element;

said control voltage also being coupled to a control terminal of a second control element with a controlled terminal of the second control element being coupled to the integrated circuit to be stabilized and operating the second control element in a saturation region with a corresponding controlled terminal current; and controlling the gain-bandwidth product of the integrated circuit with respect to said ambient operating conditions by establishing a bias current in the integrated circuit that corresponds to the controlled terminal current of the second control element.

2. The method of claim 1, wherein the controlled terminal current of the second control element is coupled to an input stage of said integrated circuit.

3. The method of claim 1, wherein the controlled terminal current of the second control element is coupled to said integrated circuit by current mirroring.

4. The method of claim 1, wherein the controlled terminal current of the second control element is coupled to said integrated circuit by current scaling.

5. A method of stabilizing a gain-bandwidth product for an integrated circuit, comprising:

operating a first capacitance element that tracks a load capacitance of an integrated circuit to be stabilized over a given range of ambient operating conditions;

setting a conductance of a first control element having a control terminal and first and second controlled terminals, to correspond to an effective conductance of said first capacitance element, by switching one terminal of the capacitance element at a certain clock frequency with respect to an input of a servo amplifier circuit, and switching another terminal of the capacitance element at said clock frequency with respect to two voltage levels having a determined offset, the controlled terminals of the first control element being coupled between a reference voltage source and the input of said servo amplifier circuit to operate the first control element in a triode operating region, and developing a control voltage at an output of the servo amplifier circuit and wherein the control voltage is coupled to the control terminal of the first control element;

said control voltage is also coupled to a control terminal of a second control element, with a controlled terminal of the second control element being coupled to the integrated circuit to be stabilized, and operating the second control element in a saturation region with a corresponding controlled terminal current; and controlling the gain-bandwidth product of the integrated circuit with respect to said ambient operating conditions by establishing a bias current in the integrated circuit that corresponds to the controlled terminal current of said second control element.

6. The method of claim 5, wherein the controlled terminal current of the second control element is coupled to an input stage of said integrated circuit.

7. The method of claim 5, wherein the controlled terminal current of the second control element is coupled to said integrated circuit by current mirroring.

8. The method of claim 5, wherein the controlled terminal current of the second control element is coupled to said integrated circuit by current scaling.

9. The method of claim 5, including operating a second capacitance element that tracks the load capacitance of the integrated circuit to be stabilized over the given range of ambient operating conditions, and switching one terminal of the second capacitance element at said certain clock frequency with respect to an input of the servo amplifier circuit, and switching another terminal of the second capacitance element at said clock frequency with respect to two voltage levels having a determined offset.

10. An integrated circuit having a circuit configuration for stabilizing the gain-bandwidth product of an analog circuit, comprising:

a first capacitance element that tracks a load capacitance of an analog circuit to be stabilized over a given range of ambient operating conditions;

a first field effect element having a gate terminal, a source terminal, and a drain terminal;

a servo amplifier circuit that generates an output feedback control voltage;

a switch circuit that switches one terminal of the first capacitance element at a clock frequency with respect to an input of said servo amplifier circuit, and switches another terminal of the first capacitance element at said clock frequency with respect to two voltage levels having a determined offset, to set a conductance of the first field effect element to correspond to an effective conductance of said first capacitance element;

wherein the source and the drain terminals of the first field effect element are coupled between a reference voltage source and an input of said servo amplifier circuit so that the first field effect element operates in a triode operating region, and the control voltage generated at an output of the servo amplifier circuit is coupled to the gate terminal of the first field effect element;

a second field effect element having a gate terminal, a source terminal and a drain terminal;

wherein the output of said server amplifier circuit is coupled to the gate terminal of the second field effect element, and one of the source and the drain terminals of the second field effect element is coupled to the analog circuit to be stabilized, so that the second field effect element operates in a saturation region with a corresponding drain-source terminal current; and the second field effect element is coupled to the analog circuit to be stabilized to produce a bias current in the analog circuit that corresponds to the drain-source terminal current of said second field effect element, and which bias current controls the gain-bandwidth product of the analog circuit with respect to said ambient operating conditions.

11. An integrated circuit according to claim 10, wherein said drain-source terminal current of the second field effect element is coupled to an input stage of the analog circuit to be stabilized.

12. An integrated circuit according to claim 10, wherein said drain-source terminal current of the second field effect element is coupled to said analog circuit by a current mirror circuit.

13. An integrated circuit according to claim 10, wherein said drain-source terminal current of the second field effect element is coupled to said analog circuit by a current scaling circuit.

14. An integrated circuit according to claim 10, including a second capacitance element that tracks the load capacitance of the analog circuit to be stabilized over the given range of ambient operating conditions, and said switch circuit switches one terminal of the second capacitance element at said clock frequency with respect to an input of said servo amplifier circuit, and switches another terminal of the second capacitance element at said clock frequency with respect to two voltage levels having a determined offset.

15. An integrated circuit according to claim 10, wherein said circuit configuration is formed with the analog circuit to be stabilized on a common integrated circuit substrate.

16. An integrated circuit according to claim 15, wherein the common integrated circuit substrate includes a CMOS substrate.

* * * * *